(12) United States Patent
Chen

(10) Patent No.: US 7,378,323 B2
(45) Date of Patent: May 27, 2008

(54) SILICIDE PROCESS UTILIZING PRE-AMORPHIZATION IMPLANT AND SECOND SPACER

(75) Inventor: Ming-Tsung Chen, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 40 days.

(21) Appl. No.: 11/456,091

(22) Filed: Jul. 7, 2006

(65) Prior Publication Data
US 2006/0252213 A1  Nov. 9, 2006

Related U.S. Application Data

(62) Division of application No. 10/907,126, filed on Mar. 22, 2005, now Pat. No. 7,105,412.

(51) Int. Cl.
*H01L 21/336* (2006.01)
*H01L 21/4763* (2006.01)

(52) U.S. Cl. .................. 438/303; 438/301; 438/302; 438/299; 438/528; 438/585; 438/592; 438/595; 257/E21.41; 257/E21; 257/336; 257/E21.345

(58) Field of Classification Search .............. 438/299, 438/301–303, 528, 585, 592; 257/E21.41, 257/E21.336, E21.345
See application file for complete search history.

(56) References Cited

U.S. PATENT DOCUMENTS

| 5,885,886 | A  | * | 3/1999 | Lee | 438/528 |
| 6,897,118 | B1 | * | 5/2005 | Poon et al. | 438/303 |
| 6,943,085 | B2 | * | 9/2005 | Wang et al. | 438/305 |
| 2005/0208765 | A1 | * | 9/2005 | Wacquant et al. | 438/664 |

* cited by examiner

*Primary Examiner*—Michael Lebentritt
*Assistant Examiner*—Mohsen Ahmadi
(74) *Attorney, Agent, or Firm*—Winston Hsu

(57) ABSTRACT

A gate electrode is formed on a substrate with a gate insulating layer therebetween. A liner is then deposited on sidewalls of the gate electrode. Source/drain extensions are implanted into the substrate. A first spacer is then formed on the liner. Deep source/drain are implanted into the substrate. A second spacer is formed at the foot of the first spacer. A tilt-angle pre-amorphization implant (PAI) is conducted to form an amorphized layer next to the second spacer. A metal layer is then sputtered on the amorphized layer. The metal layer reacts with the amorphized layer to form a metal silicide layer thereto.

4 Claims, 15 Drawing Sheets

SILICIDE PROCESS UTILIZING PRE-AMORPHIZATION IMPLANT AND SECOND SPACER

CROSS REFERENCE TO RELATED APPLICATIONS

This is a divisional application of U.S. application Ser. No. 10/907,126 filed Mar. 22, 2005 now U.S. Pat. No. 7,105,412.

BACKGROUND OF THE INVENTION

1. Field of the Invention

The present relates generally to semiconductor device fabrication. More particularly, the present invention relates to a silicide process utilizing pre-amorphization implant (PAI) and a second spacer.

2. Description of the Prior Art

As known in the art, silicide such as titanium silicide ($TiSi_2$) is a typical contact material used to reduce contact resistance. It is also known that $TiSi_2$ exists as a C49 phase or as a C54 phase. When using the general processing conditions for forming $TiSi_2$, the less desirable, higher-resistivity C49 phase is formed first. In order to obtain the lower-resistivity C54 phase, a second high-temperature annealing step is required. Besides, the titanium silicide process is flawed because each titanium atom consumes two silicon atoms to form the titanium silicide.

To cope with the difficulties arose due to the use of titanium silicide, nickel (Ni) has been used to replace titanium in the silicide process. FIGS. 1-4 are schematic, cross-sectional diagrams showing the typical nickel silicide process. As shown in FIG. 1, a gate 12 is formed on a substrate 10 with a gate oxide layer 14 interposed therebetween. An offset lining oxide layer 16 is typically formed on the sidewalls of the gate 12 and extends to the main surface of the substrate 10. A pair of silicon nitride spacers 18 is formed on the offset lining oxide layer 16. Source/drain extension regions 22 are formed under the silicon nitride spacers 18. After the formation of the silicon nitride spacers 18, dopants are implanted into the substrate 10 to form source/drain regions 24.

Subsequently, as shown in FIG. 2, a pre-amorphization implant (PAI) 30 is carried out to form an amorphized layer 32. PAI is accomplished by implanting an amorphizing substance such as Ge into the substrate 10 at a tilt angle. The amorphized layer 32 overlaps with the silicon nitride spacer 18.

As shown in FIG. 3, a blanket nickel layer 42 is then sputtered onto the substrate 10. Finally, as shown in FIG. 4, the nickel layer 42 reacts with the substrate 10 and the gate 12 to form nickel silicide layer 52. The un-reacted metal is then removed from the wafer surface by wet etching.

However, it has been discovered that species such as Ge implanted into the substrate 10 during the PAI process easily deactivate the dopants within the source/drain extension regions 22 (extension dopant deactivation), hence degrading the transistor performance. Further, a wet pre-clean process is ordinarily performed before silicidation. The offset lining oxide layer 16 is easily attacked by the wet pre-clean agent, thus causing so-called nickel silicide piping effect.

In light of the above, there is a need to provide an improved method to fabricate a transistor with silicided source and drain without deteriorating the performance of the transistor.

SUMMARY OF THE INVENTION

The primary object of the present invention is to provide an improved method for fabricating a metal-oxide-semiconductor transistor device to solve the above-mentioned problems.

According to the claimed invention, one aspect of this invention discloses a method of making a transistor device having silicided source/drain. A gate electrode is formed on a substrate with a gate insulating layer therebetween. A liner is then deposited on sidewalls of the gate electrode. Source/drain extensions are implanted into the substrate. A first spacer is then formed on the liner. Deep source/drain are implanted into the substrate. A second spacer is formed at the foot of the first spacer. A tilt-angle pre-amorphization implant (PAI) is conducted to form an amorphized layer next to the second spacer. A metal layer is then sputtered on the amorphized layer. The metal layer reacts with the amorphized layer to form a metal silicide layer thereto.

Another aspect of the present invention discloses a method of making a transistor device having silicided source/drain, comprising the following steps:

(1) forming a gate electrode on a substrate with a gate insulating layer therebetween;
(2) forming a liner on sidewalls of the gate electrode;
(3) implanting a source/drain extensions into the substrate;
(4) forming a first spacer on the liner;
(5) implanting a source/drain into the substrate
(6) performing a pre-amorphization implant (PAI) to form an amorphized layer next to the first spacer, wherein the PAI is carried out at an incident implant direction that is normal to a main surface of the substrate;
(7) forming a second spacer at the foot of the first spacer;
(8) forming a metal layer on the amorphized layer; and
(9) reacting the metal layer with the amorphized layer to form a metal silicide layer thereto.

These and other objectives of the present invention will no doubt become obvious to those of ordinary skill in the art after reading the following detailed description of the preferred embodiment that is illustrated in the various figures and drawings.

DETAILED DESCRIPTION

The present invention is directed to a silicide process utilizing pre-amorphization implant (PAI) and a second spacer. The advantages include: (1) the extension dopant deactivation is minimized since less area of the extension region is amorphized, thus the device performance can be improved; (2) the second spacer can avoid the nickel silicide piping effect.

Figure 1:
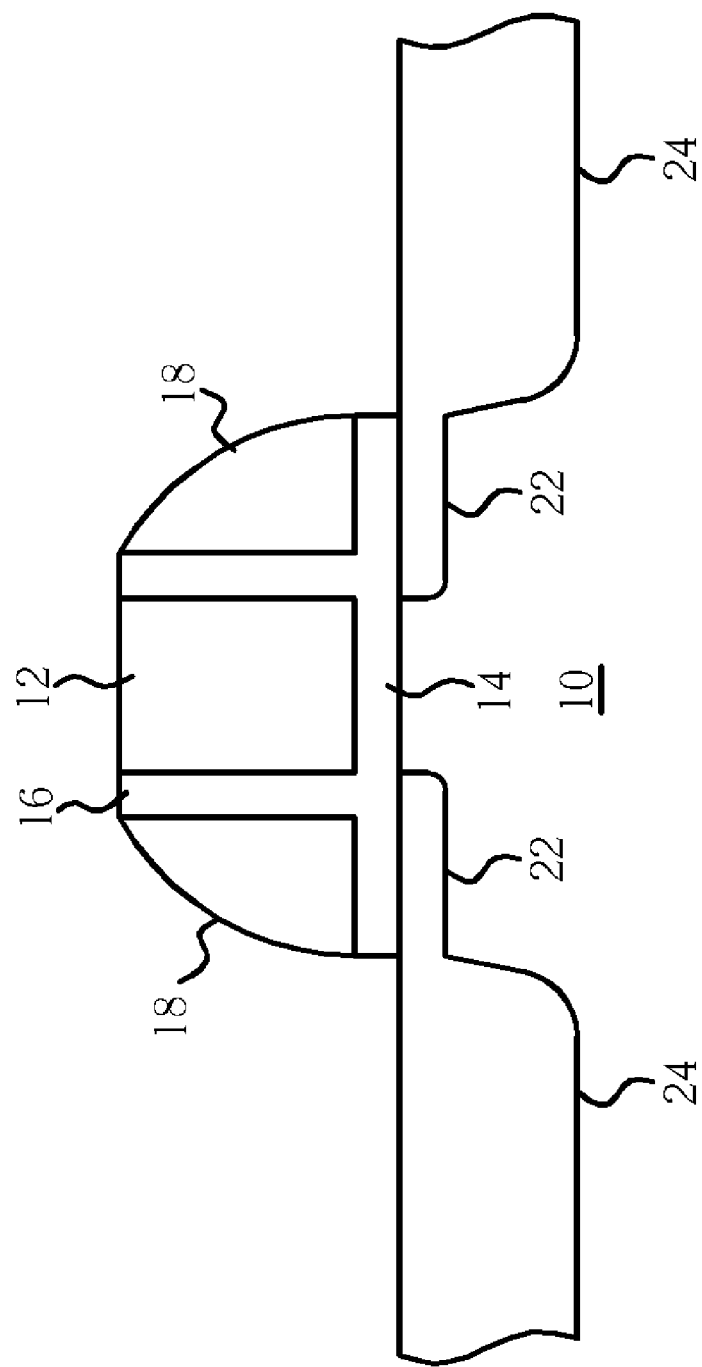
FIGS. 1-4 are schematic, cross-sectional diagrams showing the nickel silicide process according to the prior art method.
Figure 2:
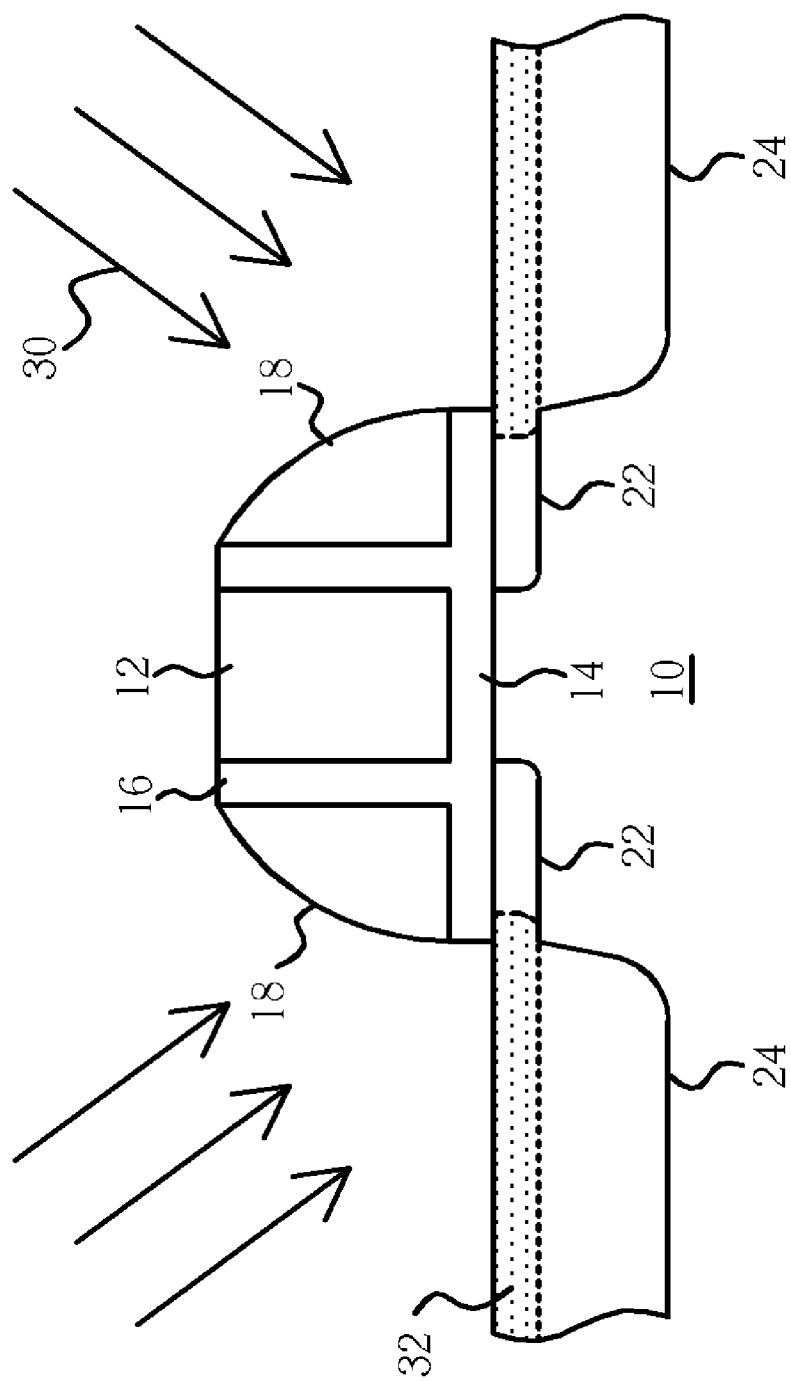
Figure 3:
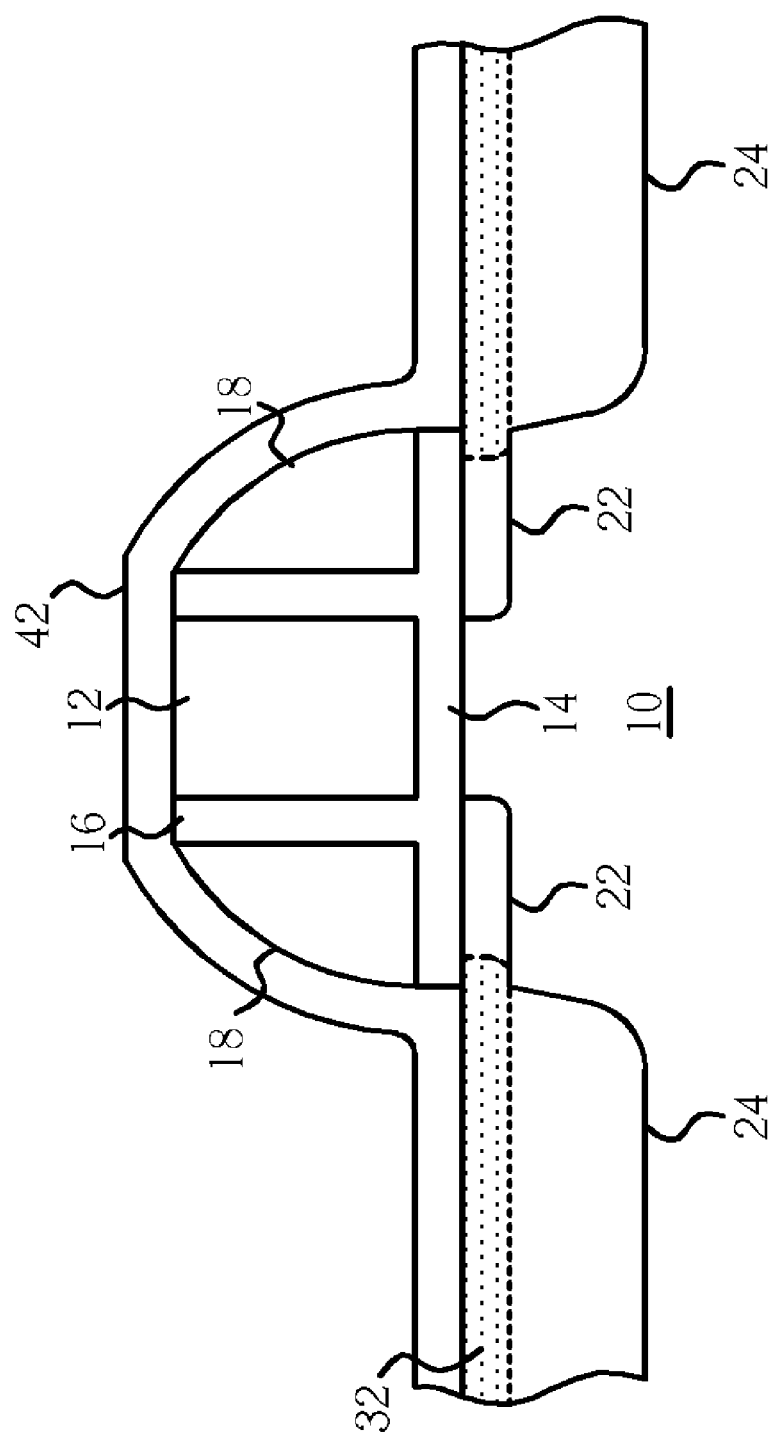
Figure 4:
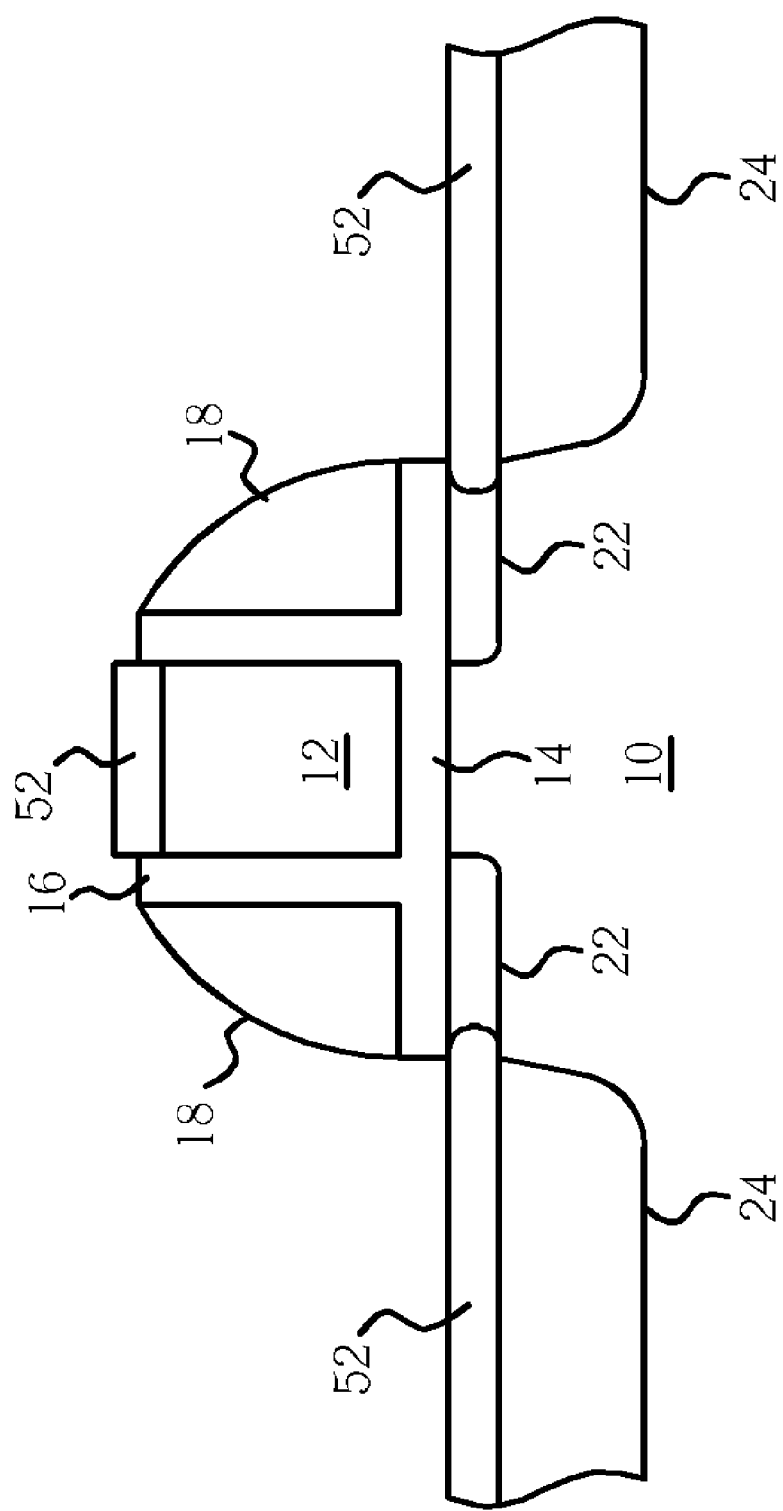
Figure 5:
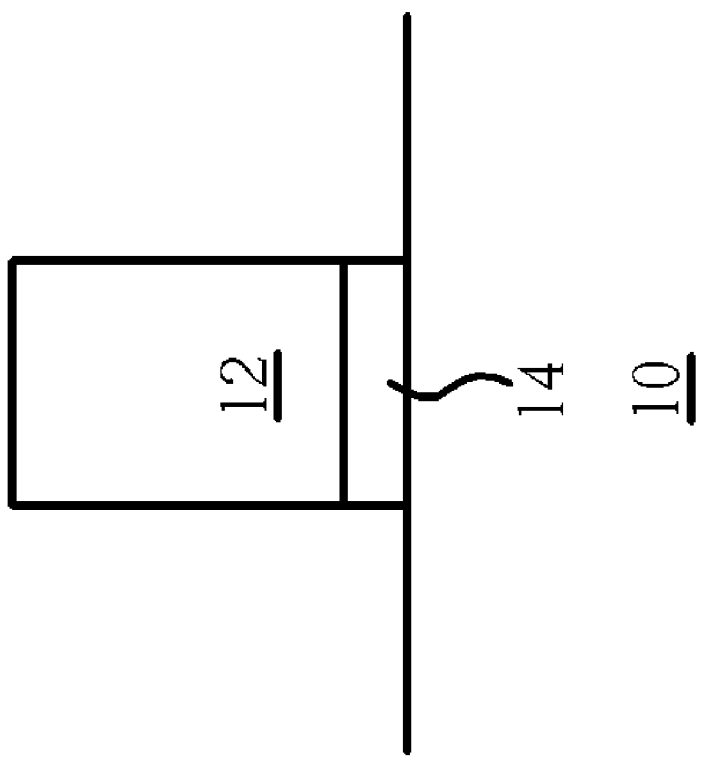
FIGS. 5-10 are schematic, cross-sectional diagrams showing one preferred embodiment of the present invention.

FIGS. 5-10 are schematic, cross-sectional diagrams showing the improved nickel silicide process according to one preferred embodiment of the present invention. As shown in FIG. 5, a gate electrode 12 is formed over a substrate 10 such as a P type silicon substrate, with a gate oxide layer 14 therebetween.

Figure 6:
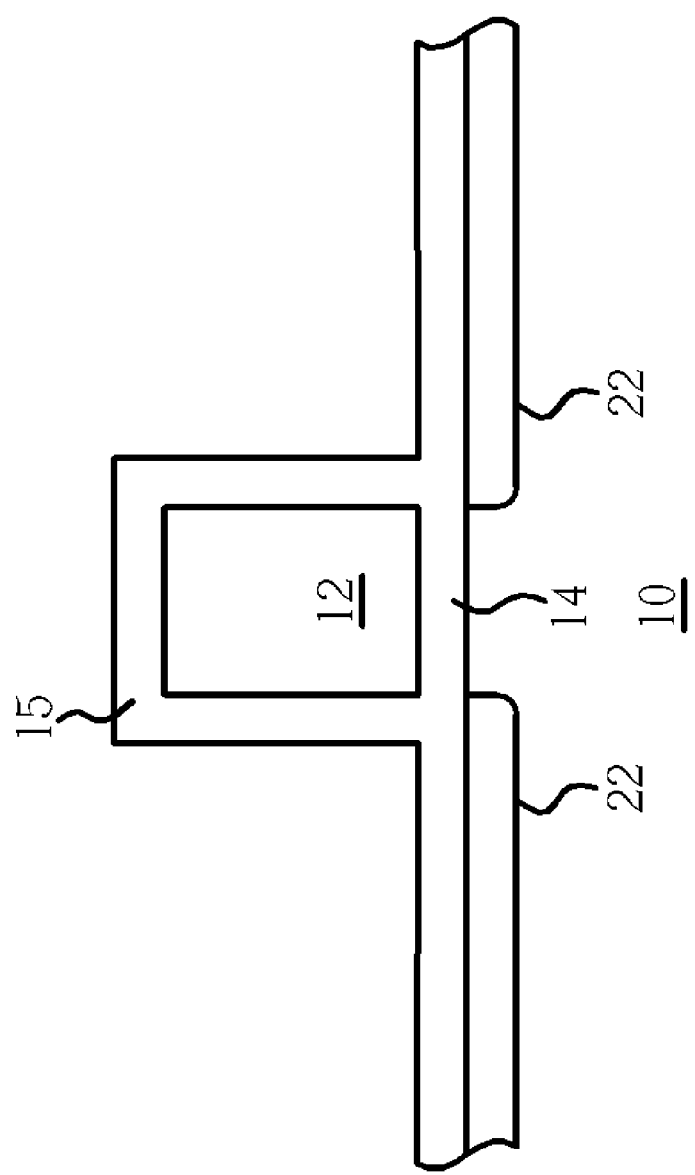

As shown in FIG. 6, a lining layer 15, preferably a silicon dioxide layer, is then deposited over the top surface and sidewalls of the gate electrode 12, and on the exposed surface of the substrate 10. The thickness of the lining layer 15 typically ranges between 50 angstroms and 400 angstroms, but not limited thereto. An ion implantation process is carried out to implant dopant species such as phosphorus, arsenic or antimony into the substrate 10 so as to form shallow junction source/drain extension regions 22.

Figure 7:
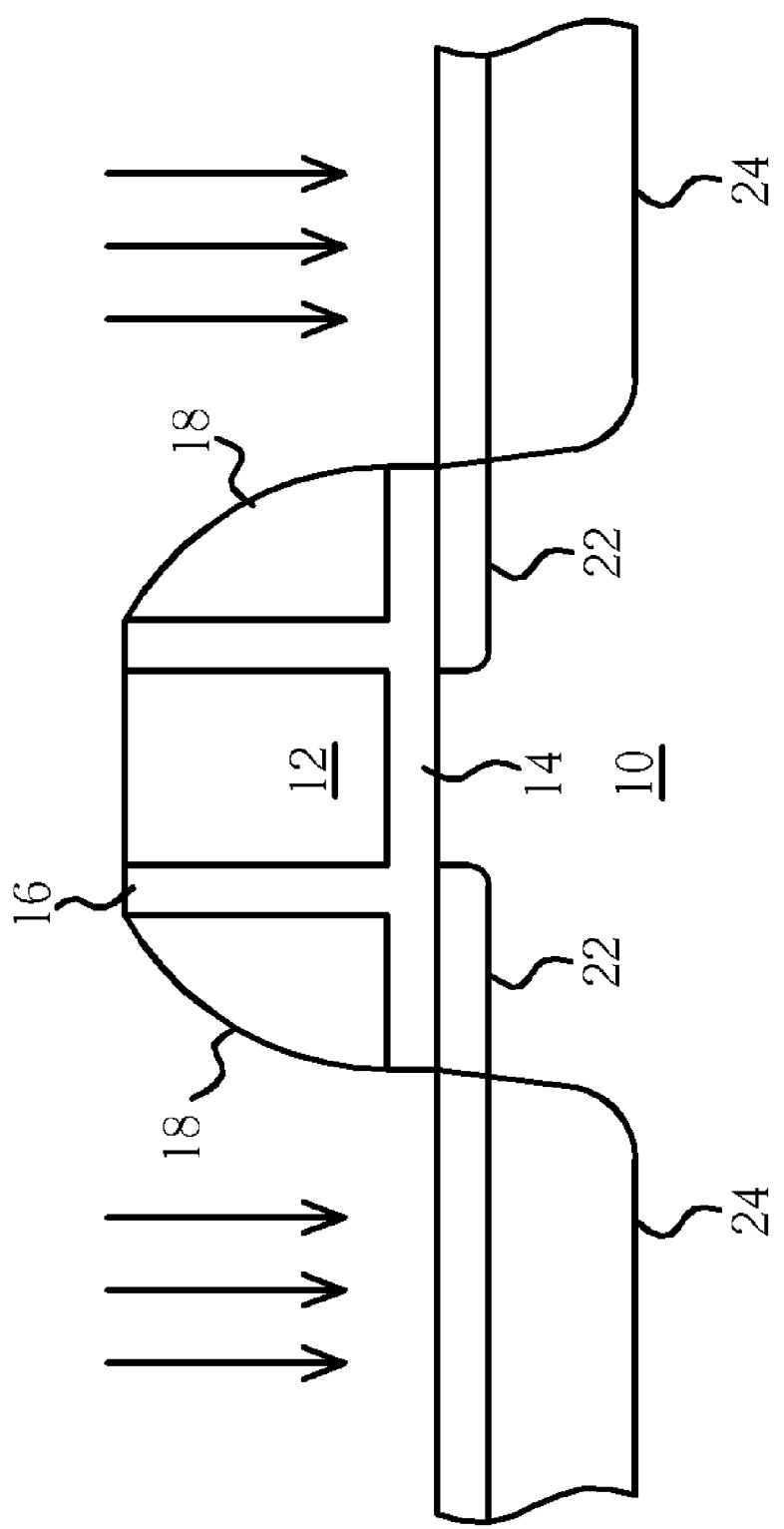

As shown in FIG. 7, a layer of silicon nitride (not shown) is deposited on the lining layer 15. An anisotropic dry etching is then carried out to etch the silicon nitride layer and the lining layer 15, thereby forming a pair of silicon nitride spacers 18 and L-shaped liner layer 16 on the sidewalls of the gate electrode 12. Subsequently, a high-dosage ion implantation is conducted to form deep source/drain regions 24 in the substrate 10.

Figure 8:
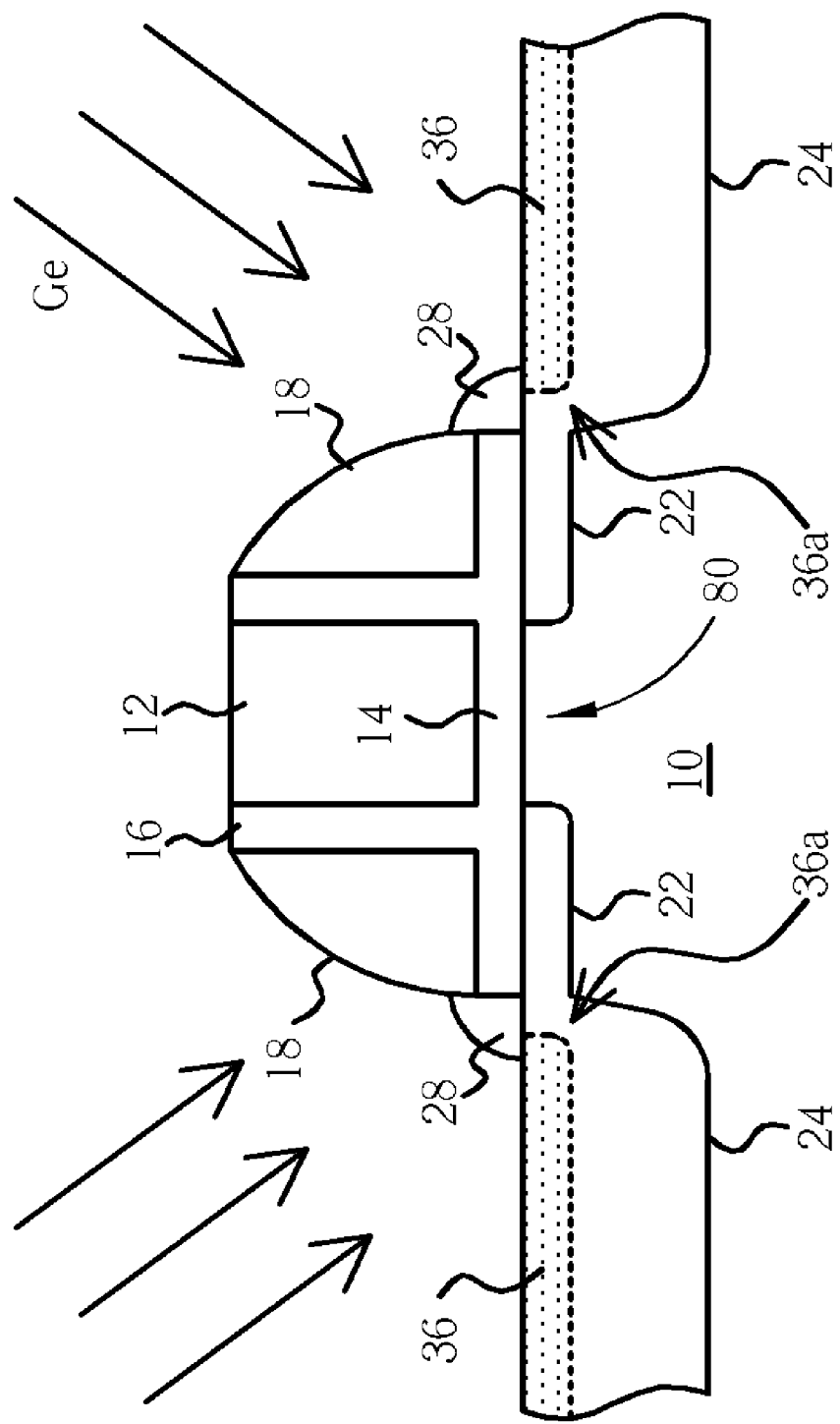

As shown in FIG. 8, before conducting the pre-amorphization implant (PAI) process and the wet pre-clean process prior to the silicidation process, a second spacer 28 is formed at the foot of the silicon nitride spacers 18. The second spacer 28 may be made of dielectric materials such as silicon oxide or silicon nitride. Thereafter, a wet pre-clean process is conducted to remove unwanted substances such as particles or native oxide from the substrate surface. At this phase, the L-shaped liner layer 16 is shielded from the wet pre-clean corrosion by the second spacer 28. After the wet pre-clean process, the PAI process is conducted to form an amorphized layer 36. The PAI process is accomplished by implanting an amorphizing substance such as Ge, Xe or Ar into the substrate 10 at a tilt angle (i.e., the direction of the incident amorphizing ion beam is not normal to the main surface of the substrate or wafer). In another case, the wet pre-clean may be carried out after the PAI process.

As specifically indicated in FIG. 8, comparing with the prior art, the front ends 36a of the amorphized layer 36 are withdrawn from the source/drain extension regions 22 that are directly under the silicon nitride spacers 18, and thus become farther from the channel region 80 between the source/drain extension regions 22. Due to the second spacer 28, the amorphized layer 36 substantially does not overlap with the silicon nitride spacers 18.

Figure 9:
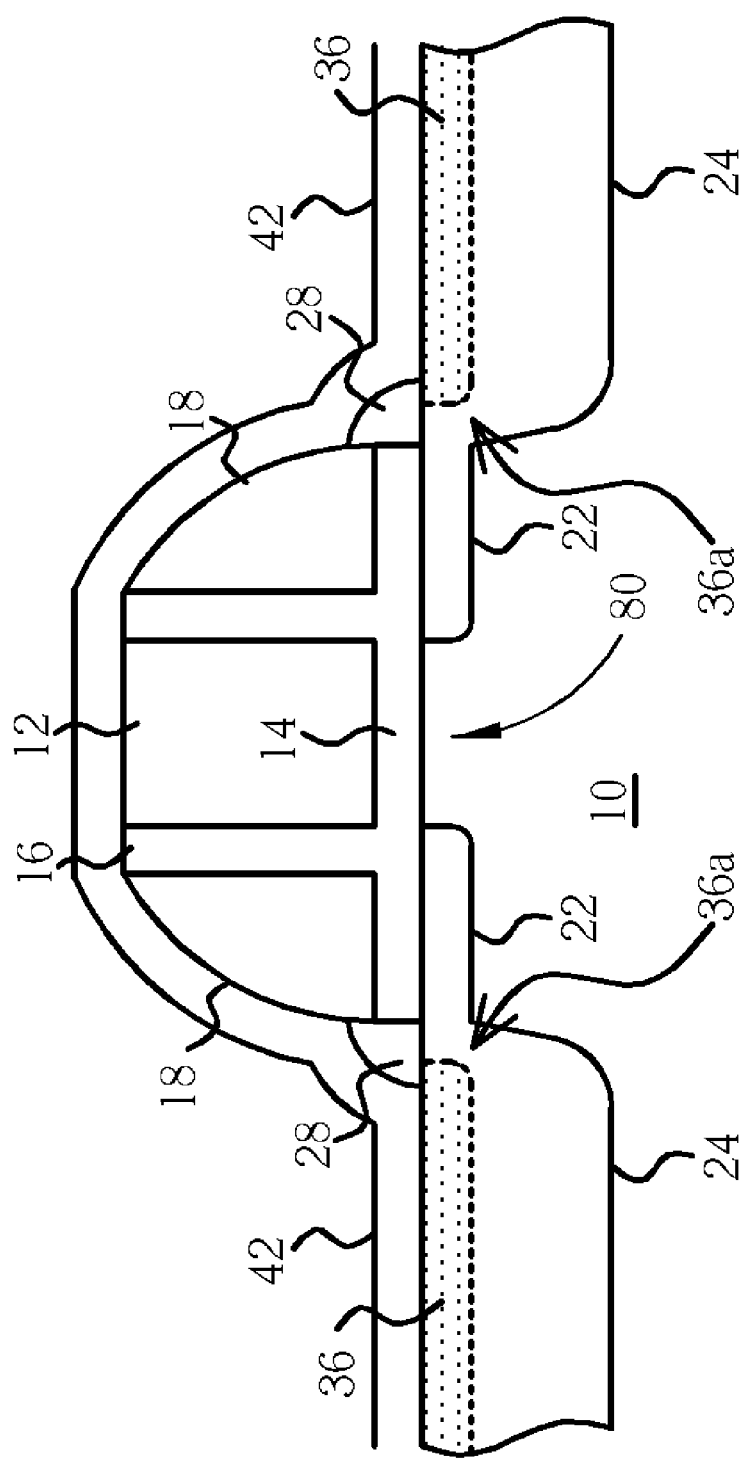
Figure 10:
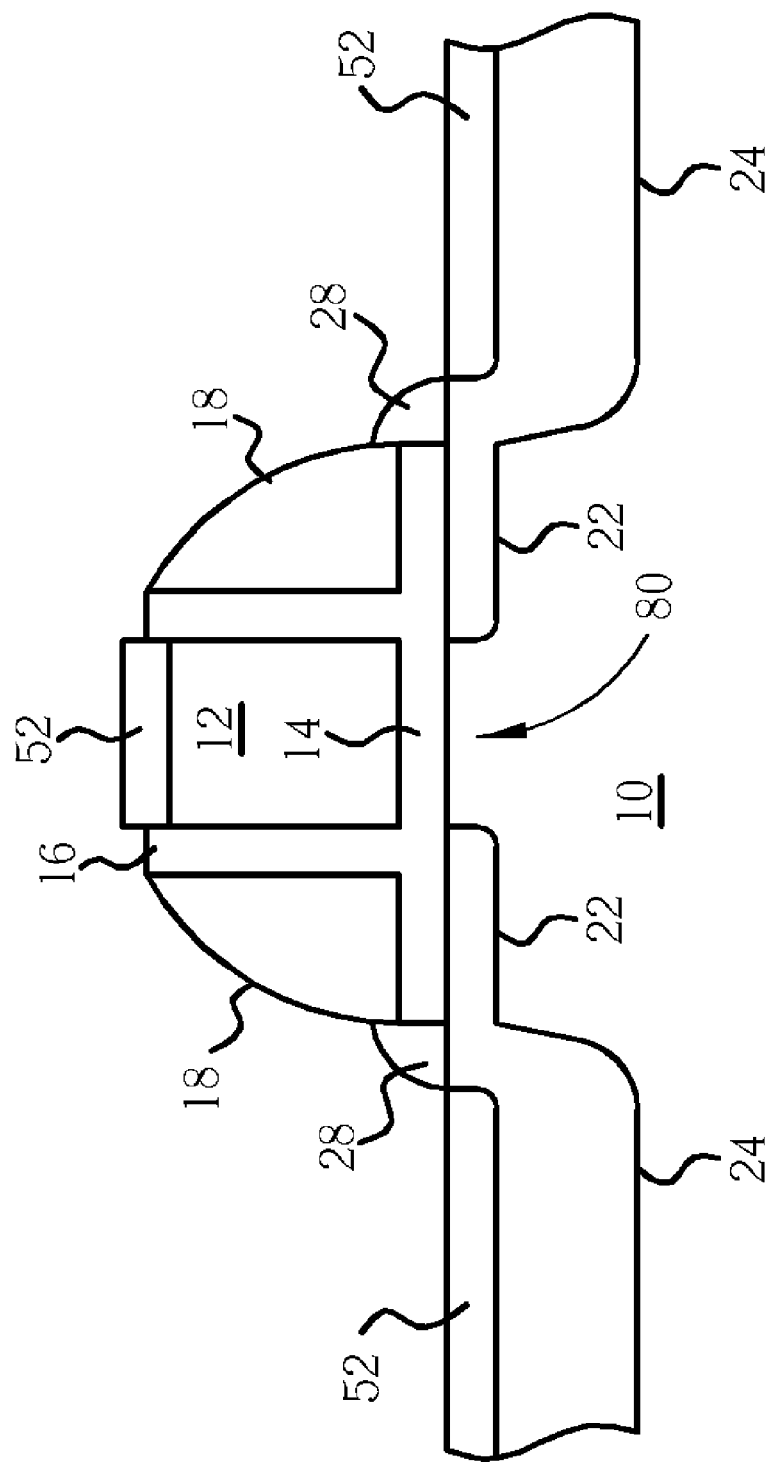

As shown in FIG. 9, a metal layer 42 such as nickel, platinum, palladium, molybdenum or any alloy thereof is then blanket sputtered onto the substrate 10. As shown in FIG. 10, the metal layer 42 reacts with the substrate 10 and the gate electrode 12 to form silicide layer 52 such as nickel silicide (NiSi). The un-reacted metal is then removed from the wafer surface by wet etching.

Figure 11:
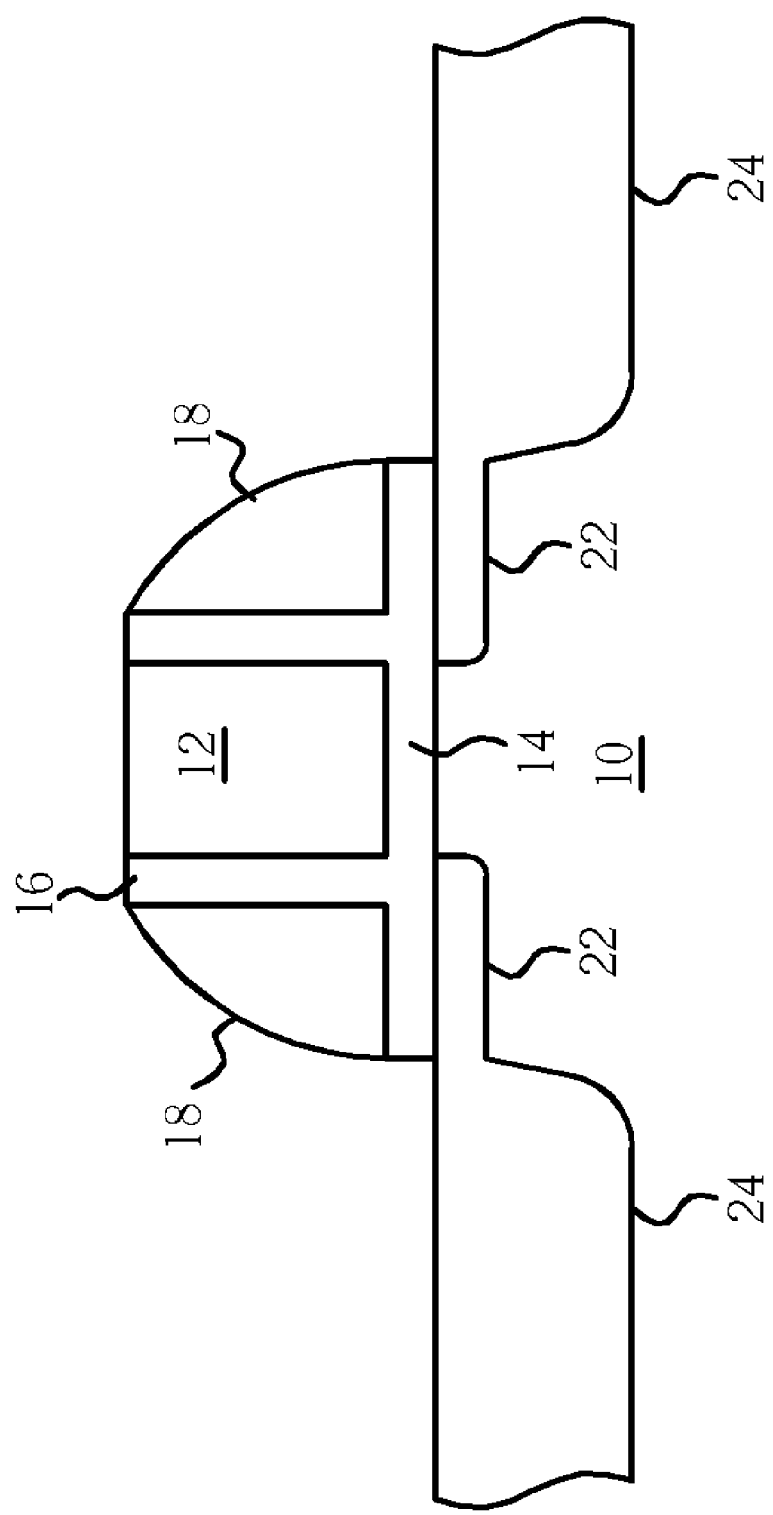
FIGS. 11-15 are schematic, cross-sectional diagrams showing the improved silicide process according to another preferred embodiment of the present invention.

FIGS. 11-15 are schematic, cross-sectional diagrams showing the improved nickel silicide process according to another preferred embodiment of the present invention. As shown in FIG. 11, a gate electrode 12 is formed over a substrate 10 such as a P type silicon substrate, with a gate oxide layer 14 therebetween. A lining layer is then deposited over the top surface and sidewalls of the gate electrode 12, and on the exposed surface of the substrate 10. An ion implantation process is carried out to implant dopant species such as phosphorus, arsenic or antimony into the substrate 10 so as to form shallow junction source/drain extension regions 22.

A layer of silicon nitride (not shown) is deposited on the lining layer. An anisotropic dry etching is then carried out to etch the silicon nitride layer and the lining layer, thereby forming a pair of silicon nitride spacers 18 and L-shaped liner layer 16 on the sidewalls of the gate electrode 12. Subsequently, a high-dosage ion implantation is conducted to form deep source/drain regions 24 in the substrate 10.

Figure 12:
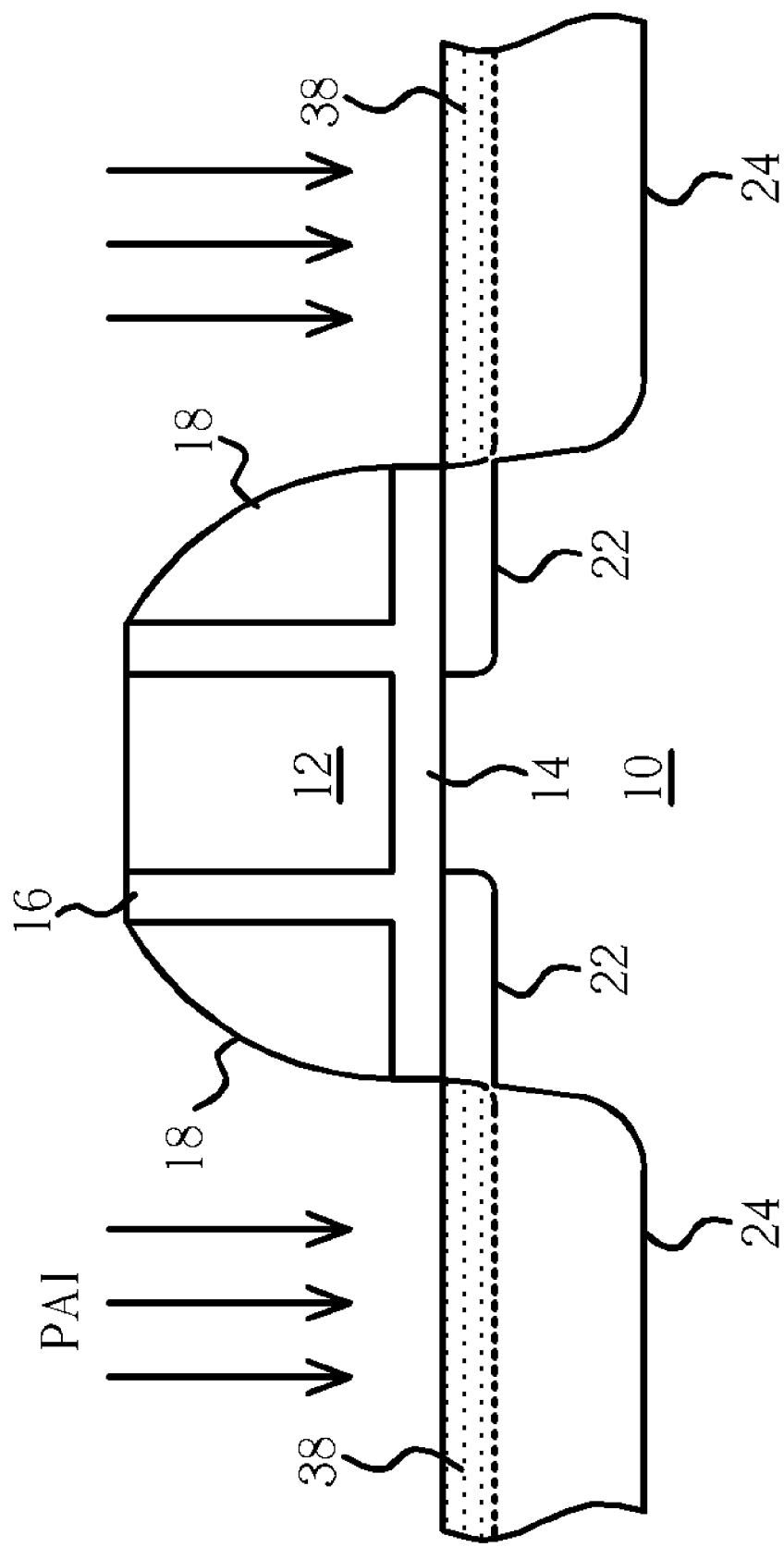

As shown in FIG. 12, a PAI process is conducted to form an amorphized layer 38. The PAI process is accomplished by implanting an amorphizing substance such as Ge, Xe or Ar into the substrate 10. According to this embodiment, the direction of the incident amorphizing ion beam is normal to the main surface of the substrate or wafer.

Figure 13:
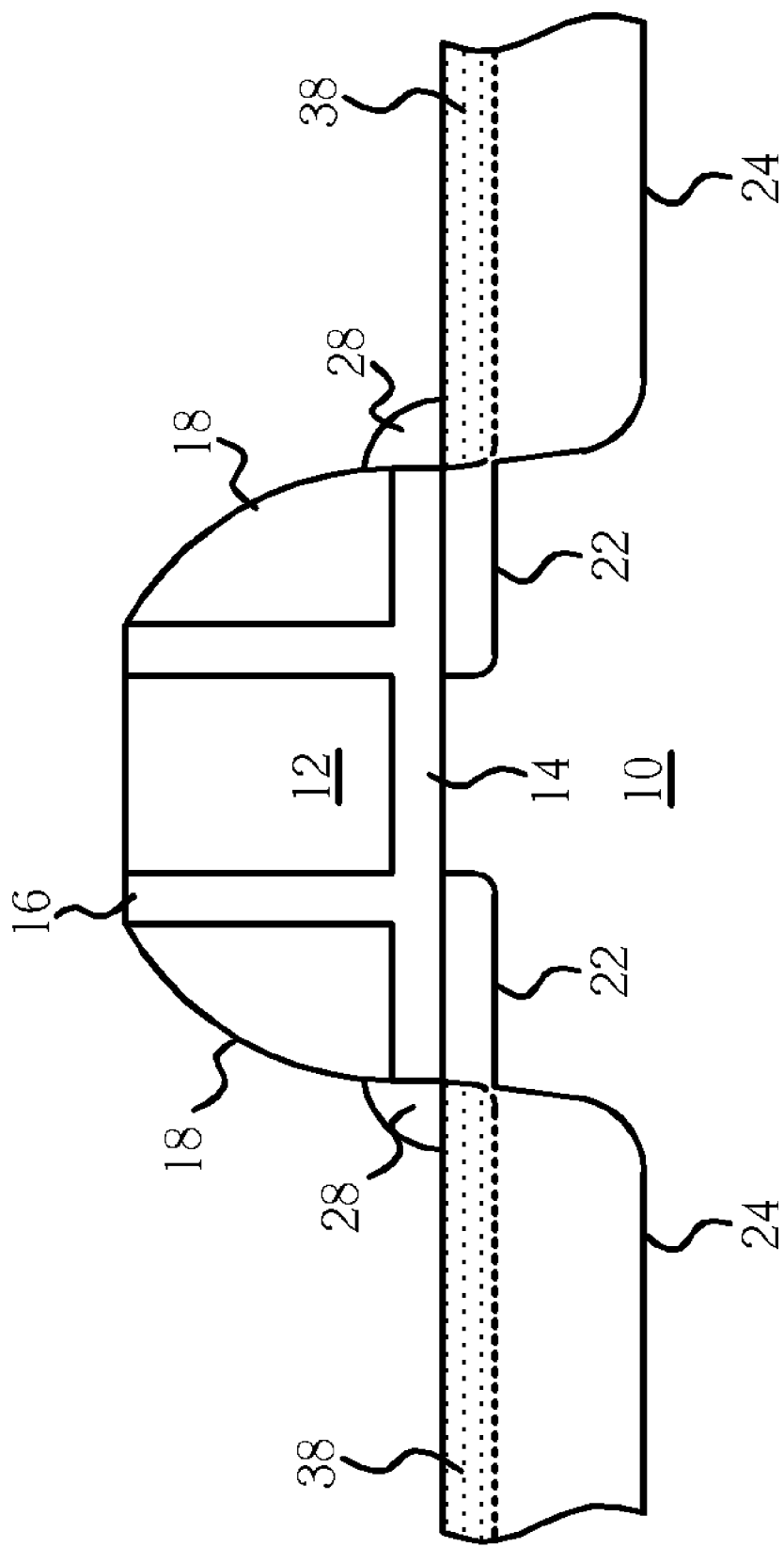

After conducting the PAI process, as shown in FIG. 13, a second spacer 28 is formed at the bottom of the silicon nitride spacers 18. The second spacer 28 may be made of dielectric materials such as silicon oxide or silicon nitride. Thereafter, a wet pre-clean process is conducted to remove unwanted substances such as particles or native oxide from the substrate surface. At this phase, the L-shaped liner layer 16 is shielded from the wet pre-clean corrosion by the second spacer 28.

Figure 14:
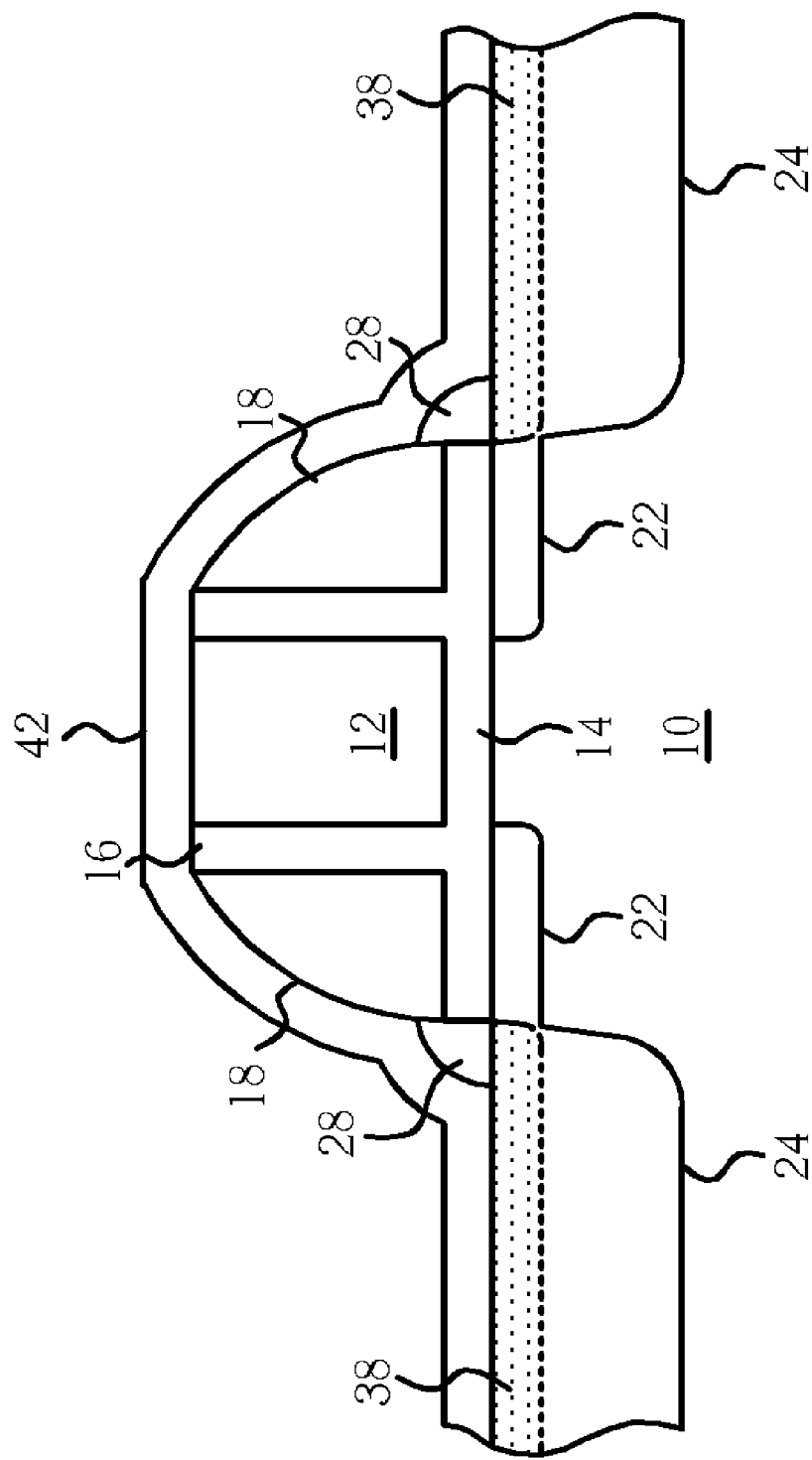

As shown in FIG. 14, a metal layer 42 such as nickel, platinum, palladium, molybdenum or any alloy thereof is then blanket sputtered onto the substrate 10.

Figure 15:
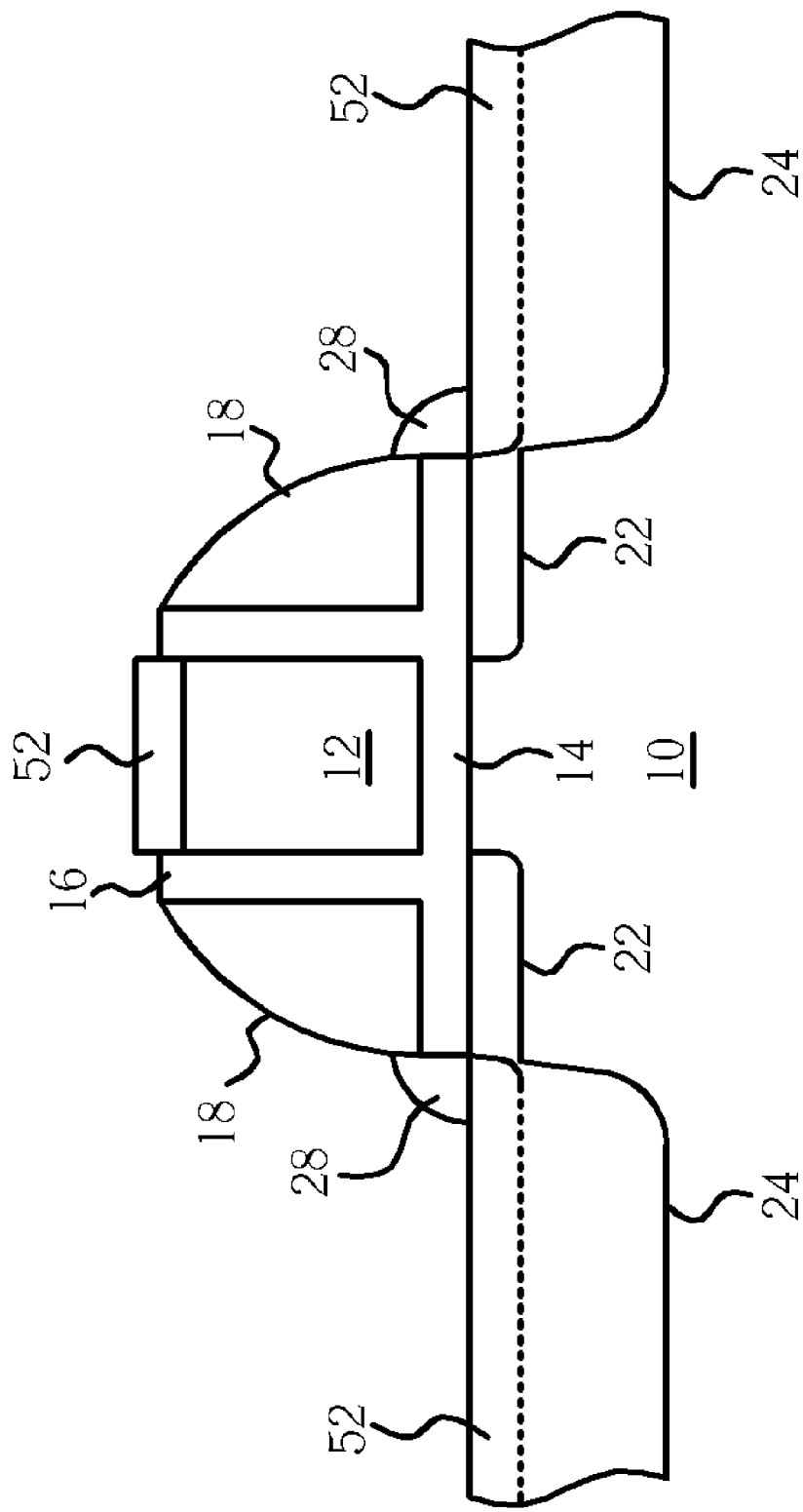

Finally, as shown in FIG. 15, the metal layer 42 reacts with the substrate 10 and the gate electrode 12 to form silicide layer 52 such as nickel silicide (NiSi). The un-reacted metal is then removed from the wafer surface by wet etching.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of making a transistor device having silicided source/drain, comprising:
    forming a gate electrode on a substrate with a gate insulating layer therebetween;
    forming a liner on sidewalls of the gate electrode;
    implanting a source/drain extensions into the substrate;
    forming a first spacer on the liner;
    implanting a source/drain into the substrate;
    performing a pre-amorphization implant (PAI) to form an amorphized layer next to the first spacer, wherein the PAI is carried out at an incident implant direction that is normal to a main surface of the substrate;
    forming a second spacer at the foot of the first spacer;
    forming a metal layer on the amorphized layer; and
    reacting the metal layer with the amorphized layer to form a metal silicide layer thereto.

2. The method according to claim 1 wherein the metal layer comprises nickel, platinum, palladium, molybdenum, or any alloy thereof.

3. The method according to claim 1 wherein the first spacer is a silicon nitride spacer.

4. The method according to claim 1 wherein the second spacer is a silicon oxide spacer.

* * * * *